(12) United States Patent
Krishnappa et al.

(10) Patent No.: US 7,253,657 B2
(45) Date of Patent: Aug. 7, 2007

(54) APPARATUS AND METHODS FOR CONFIGURATION OF PROGRAMMABLE LOGIC DEVICES

(75) Inventors: Mukunda Krishnappa, Santa Clara, CA (US); Keith Duwel, Los Gatos, CA (US); Renxin Xia, San Jose, CA (US)

(73) Assignee: Altera Corporation, San Jose, CA (US)

( * ) Notice: Subject to any disclaimer, the term of this patent is extended or adjusted under 35 U.S.C. 154(b) by 67 days.

(21) Appl. No.: 10/736,167

(22) Filed: Dec. 15, 2003

(65) Prior Publication Data

US 2006/0038585 A1    Feb. 23, 2006

(51) Int. Cl.
*H03K 19/173*    (2006.01)
*G06F 7/38*    (2006.01)

(52) U.S. Cl. .............................. 326/38; 326/40; 326/46
(58) Field of Classification Search .................. 326/38, 326/40, 41, 46
See application file for complete search history.

(56) References Cited

U.S. PATENT DOCUMENTS

| | | | |
|---|---|---|---|
| 5,745,734 A * | 4/1998 | Craft et al. .................... | 716/16 |
| 6,028,445 A * | 2/2000 | Lawman ....................... | 326/38 |
| 6,259,271 B1 * | 7/2001 | Couts-Martin et al. ....... | 326/40 |
| 6,366,117 B1 * | 4/2002 | Pang et al. .................... | 326/38 |
| 6,507,943 B1 | 1/2003 | Kelem | |
| 6,748,456 B1 * | 6/2004 | Stanton et al. ................. | 710/1 |

OTHER PUBLICATIONS

Leventis et al., "Cyclone: A Low-Cost, High-Performance FPGA", IEEE Custom Integrated Circuits Conference, Sep. 21-24, 2003, pp. 49-52.
Cyclone Device Handbook, vol. 1, Ch. 13, "Configuring Cyclone FPGAs", Altera Corporation, Jul. 2003, pp. 1-56.
International Search Report, PCT/US2004/042064, ALTR:024PCT, 13 pgs., Dec. 15, 2004.

\* cited by examiner

*Primary Examiner*—Daniel Chang
(74) *Attorney, Agent, or Firm*—Law Offices of Maximilian R. Peterson

(57) ABSTRACT

A programmable logic device (PLD) includes configuration circuitry. The configuration circuitry is adapted to receive serial configuration data from a configuration device. The configuration circuitry is further adapted to program a function of the PLD without using an input buffer to store the configuration data.

50 Claims, 6 Drawing Sheets

| ORIGINAL DATA | COMPRESSED DATA | |
|---|---|---|
| | CONTROL NIBBLE | DATA |
| 0100 0000 1000 0000 | 1010 | 0100 1000 |
| 0000 0000 0000 0001 | 0001 | 0001 |
| 0000 0000 0000 0000 | 0000 | — |
| 0001 1000 0101 1010 | 1111 | 0001 1000 0101 1010 |

APPARATUS AND METHODS FOR CONFIGURATION OF PROGRAMMABLE LOGIC DEVICES

TECHNICAL FIELD

The inventive concepts relate generally to configuring programmable electronic circuitry and, more particularly, to configuring programmable logic devices (PLDs).

BACKGROUND

PLDs provide circuit and system designers the ability to design and test a circuit or system in a relatively short amount of time. As the name suggests, the relatively short turnaround time owes to the programmability of PLDs. Typically, a PLD receives configuration data from an external device or host and uses the configuration data to configure or program PLD functionality.

Conventional techniques for programming PLDs, however, have some shortcomings. For example, the PLD may fail to receive or process in a timely manner the information that the external device or host provides. As a result, the external device or host may stall, leading to less overall efficiency or to configuration problems. A need therefore exists for an improved way of configuring PLDs so as to avoid the stalling problem that conventional techniques experience.

SUMMARY

The disclosed inventive concepts relate to apparatus and associated methods for configuring programmable electronic circuitry, such as PLDs. One aspect of the invention relates to apparatus for configuring PLDs.

In one illustrative embodiment, a PLD according to the invention includes configuration circuitry. The configuration circuitry is adapted to receive serial configuration data from a configuration device. The configuration circuitry programs or configures a function of the PLD without using an input buffer to store the configuration data.

In another illustrative embodiment, a data-processing system includes a PLD and a configuration device. The configuration device provides serial configuration data to the PLD. The PLD includes a data converter circuit. The data converter circuit converts the serial configuration data into parallel configuration data. The parallel configuration data are used to program a function of the PLD without stalling the configuration device.

In another exemplary embodiment, a data-processing system includes a PLD and a configuration device. The configuration device provides serial configuration data to the PLD. The PLD includes a data converter circuit. The data converter circuit converts the serial configuration data into parallel configuration data. The parallel configuration data are used to program a function of the PLD using a buffer to store the serial configuration data.

Another aspect of the invention concerns programming PLDs. In one illustrative embodiment, a method for configuring a PLD includes receiving serial configuration data. The serial configuration data are adapted to configure a function of the PLD. The method also includes configuring the function of the PLD by using the serial configuration data. The PLD is configured without buffering the serial configuration data.

BRIEF DESCRIPTION OF THE DRAWINGS

The appended drawings illustrate only exemplary embodiments of the invention and therefore should not be considered as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

This invention contemplates apparatus and associated methods for configuring programmable electronic circuitry, such as PLDs. Conventionally, PLD configuration suffers from stalling of the configuration device or the slowing down of the configuration process because the control circuitry of the PLD cannot decompress the configuration data and program or configure the PLD simultaneously.

In contrast, apparatus and methods according to the invention provide mechanisms for simultaneous decompression of the configuration data and the configuration or programming of the PLD, thus avoiding the stalling of the configuration device or slowing down the configuration process.

More specifically, in conventional arrangements, the configuration device may provide configuration data to the PLD at a higher rate than the PLD can accommodate. The configuration data may have a compressed format that may result in the stalling of the configuration device (because the PLD does not include decompression circuitry).

In attempting to solve that problem, conventional arrangements sometimes include a buffer for the configuration data. The buffer, however, may have an insufficient size (because of the unpredictability of the amount of configuration data) and, in any event, adds size, complexity, and cost. Even in situations where the PLD can control the rate at which the configuration device provides the configuration data, it may lack the ability to process the configuration data at sufficiently fast rates to avoid slowing down the configuration process.

The inventive concepts overcome the disadvantages described above of conventional techniques. First, the inventive concepts provide a way of simultaneously receiving the configuration data and configuring or programming the PLD. In this manner, one may program the PLD in a shorter amount of time than conventional techniques accomplish.

Second, one may use compressed PLD configuration data. The compressed configuration data avoids stalling the configuration device, avoids using a buffer to store the configuration data as it becomes available from the configuration device, and avoids slowing down the configuration process.

Third, because the inventive concepts contemplate including decompression hardware in the PLD, one may use configuration devices that lack built-in decompression hardware. As a result, one may use less expensive, off-the-shelf (or less customized) configuration devices, as desired. Those advantages will become apparent to persons of ordinary skill in the art from the description of the invention.

Figure 1:
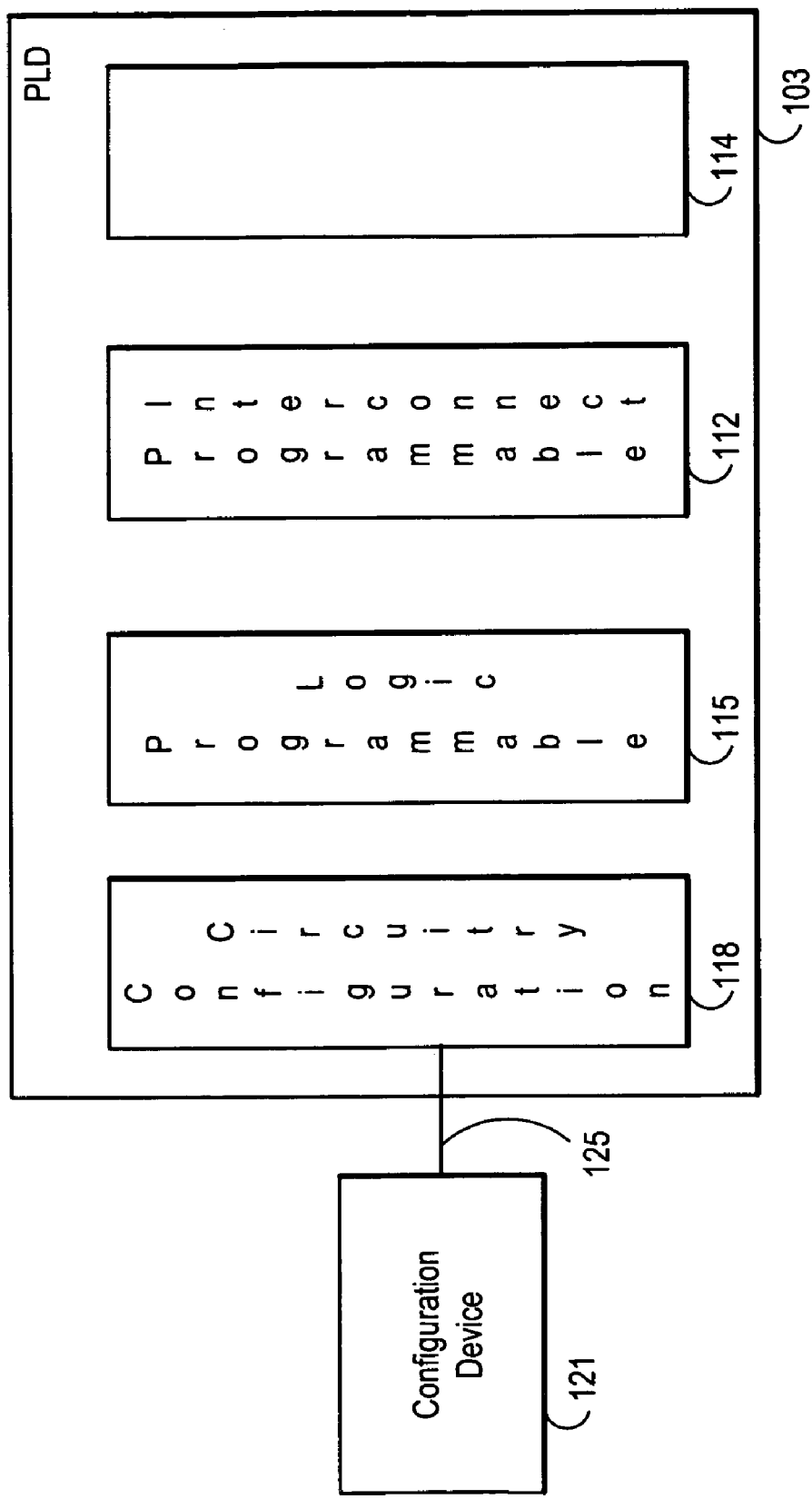
FIG. 1 shows a general block diagram of a PLD according to one illustrative embodiment of the invention.

FIG. 1 shows a general block diagram of a PLD 103 according to an illustrative embodiment of the invention. PLD 103 includes configuration circuitry 118, programmable logic circuitry 115, and programmable interconnect circuitry 112. Additionally, and as desired, PLD 103 may include one or more data processing blocks or hardware 114, such processor, communications circuitry, memory controllers, and the like, as persons of ordinary skill in the art who have the benefit of the description of the invention understand.

Note that FIG. 1 shows a simplified block diagram of PLD 103. Thus, PLD 103 may include other blocks and circuitry, as persons of ordinary skill in the art understand. Examples of such circuitry include clock generation and distribution circuits, input/output (I/O) circuitry, control and timing circuitry, test/debug circuitry, and the like.

Programmable logic circuitry 115 includes blocks of configurable or programmable logic circuitry, such as look-up tables (LUTs), product-term logic, multiplexers, logic gates, registers, memory, and the like. Programmable interconnect circuitry 112 couples to programmable logic circuitry 115 and provides configurable interconnects (coupling mechanisms) among various blocks within programmable logic circuitry 115 and other circuitry within or outside PLD 103, as desired.

PLD configuration circuitry 118 uses configuration data to program or configure the functionality of PLD 103. Configuration circuitry 118 obtains the configuration data from configuration device 121. Configuration device 121 may constitute a variety of devices, such as memories (FLASH, random-access memory (RAM), read-only memory (ROM), programmable ROM, and the like). Alternatively, configuration device 121 may constitute a host device external to PLD 103, such as a computer, processor, or other data-processing device generally, or a network, such as an Ethernet network, as desired.

As FIG. 1 illustrates, configuration device 121 communicates with PLD 103 via signal link 125. Signal link 125 may include a number of signal lines, such as data lines, control line(s), and status line(s), as desired. Through signal link 125, configuration device may obtain the configuration data to program PLD 103.

The configuration data determine the functionality of PLD 103. More specifically, PLD 103 uses the configuration data to program or configure programmable logic circuitry 115, programmable interconnect circuitry 112 (and other parts of PLD 103, as desired), as persons skilled in the art with the benefit of the description of the invention understand.

Figure 2:
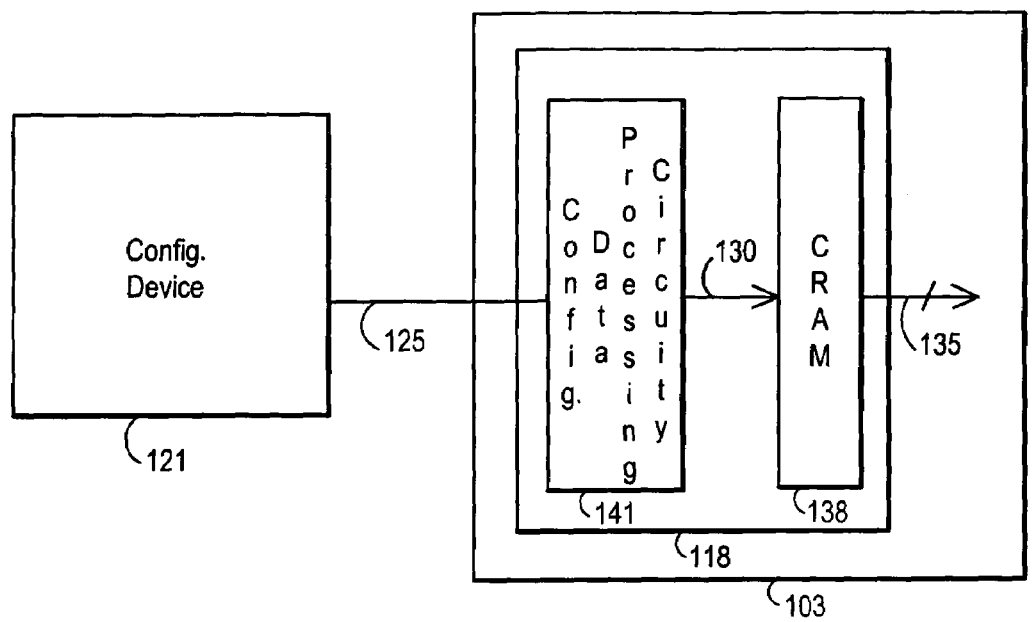
FIG. 2 illustrates a more detailed block diagram of a circuit arrangement for configuring a PLD according to an exemplary embodiment of the invention and, more specifically, illustrates additional details of the PLD configuration circuitry.

FIG. 2 shows a more detailed block diagram of a circuit arrangement for configuring a PLD according to an exemplary embodiment of the invention. More specifically, FIG. 2 illustrates additional details of configuration circuitry 118.

Configuration circuitry 118 includes configuration data processing circuitry 141 and configuration random-access memory (CRAM) 138. Configuration data processing circuitry 141 accepts configuration data from configuration device 121, processes the configuration data (as described below in detail), and provides the processed configuration data to CRAM 138.

Configuration data processing circuitry 141 communicates with CRAM 138 via signal link 130. Signal link 130 may include a desired number of signal lines (e.g., conductors) to accommodate the path for the processed configuration data from configuration data processing circuitry 141 to CRAM 138. CRAM 138 communicates with various parts of PLD 103 via signal link 135, which may include a desired number of signal lines.

CRAM 138 uses the processed configuration data to configure the functionality of PLD 103, as persons of ordinary skill in the art who have the benefit of the description of the invention understand. Thus, CRAM 138 may configure the functionality of the programmable or configurable resources of PLD 103, such as programmable logic circuitry 115 and programmable interconnect circuitry 112.

One may use the inventive concepts for configuring PLDs in several configuration modes. More specifically, one may use either a passive configuration mode or an active configuration mode, as desired, and as described below in detail.

Figure 3:
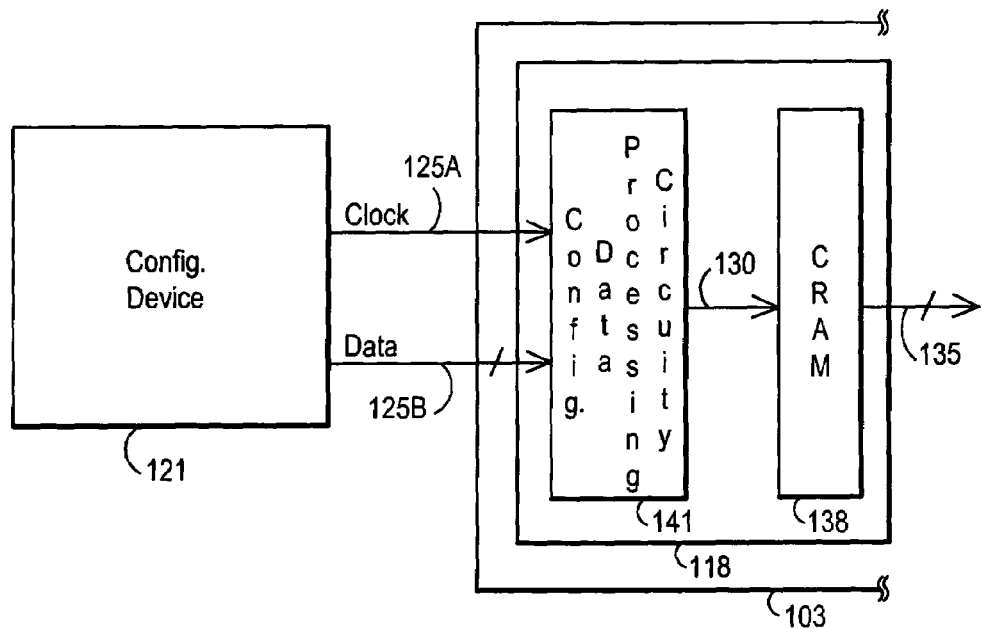
FIG. 3 depicts a circuit arrangement according to an exemplary embodiment of the invention for passive-mode configuration of a PLD.

FIG. 3 depicts a circuit arrangement according to an exemplary embodiment of the invention for passive-mode configuration of PLD 103. In this circuit arrangement, configuration device 121 provides configuration data to configuration circuitry 118 via data signal link 125B (part of signal link 125, described above). Configuration device 121 also provides a clock signal via signal link 125A (part of signal link 125, described above).

In response to the clock signal, PLD 103, and more specifically, configuration data processing circuitry 141 of configuration circuitry 118, accepts the configuration data. Configuration data processing circuitry 141 subsequently uses the configuration data to program PLD 103, as described above.

Note that, in the passive-mode configuration, PLD 103 has no control over the provision of configuration data to it. More specifically, configuration device 121 cannot determine when PLD 103 is ready to receive configuration data from it. In a typical conventional passive-mode arrangement, the configuration device would continuously send configuration data to the PLD, which might result in stalling the configuration process if the PLD fails to keep up with the configuration device.

One may attempt to avoid the stalling problem by using a buffer. Doing so, however, introduces additional problems (e.g., additional cost and complexity), as described above. The inventive concepts overcome those problems by allowing uninterrupted configuration of PLD 103 in the passive-mode configuration arrangement.

Figure 4:
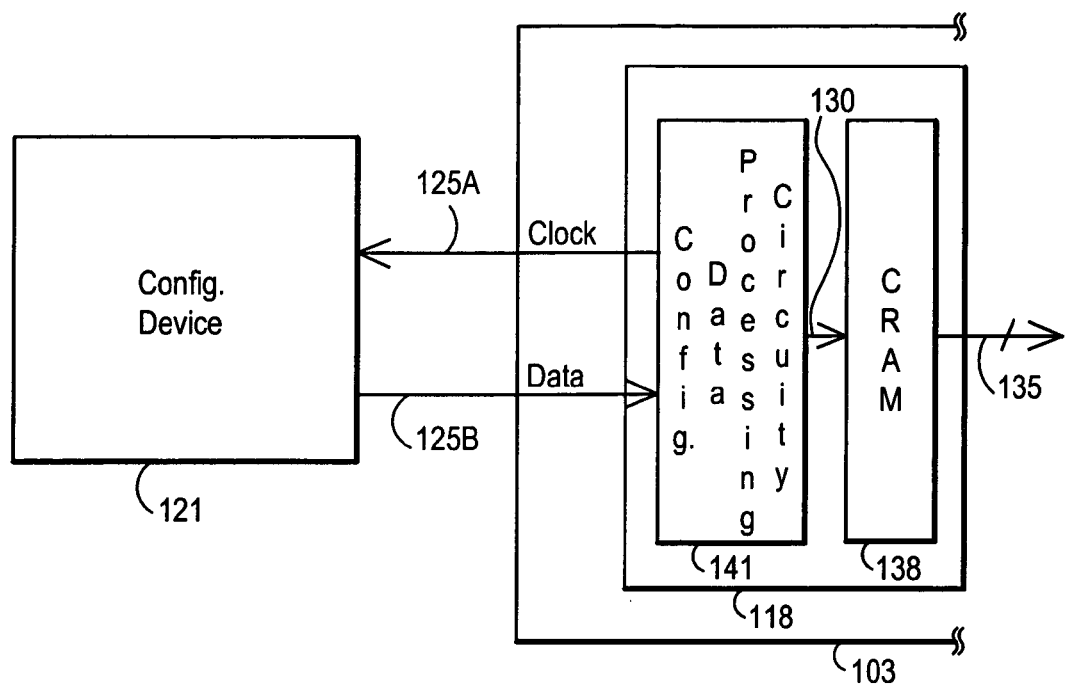
FIG. 4 shows a circuit arrangement according to an exemplary embodiment of the invention for active-mode configuration of a PLD.

In contrast to FIG. 3, FIG. 4 depicts a circuit arrangement according to an exemplary embodiment of the invention for active-mode configuration of PLD 103. In this circuit arrangement, PLD 103, more specifically configuration data processing circuitry 141 of configuration circuitry 118, provides a clock signal to configuration device 121 via signal link 125A (part of signal link 125, described above).

In response to the clock signal, configuration device 121 provides configuration data to PLD 103 via data signal link 125B (part of signal link 125, described above). PLD 103, and more specifically, configuration data processing circuitry 141 of configuration circuitry 118, accepts the configuration data. Configuration data processing circuitry 141 subsequently uses the configuration data to program PLD 103, as described above.

In the active-mode configuration arrangement, PLD 103 can interrupt the flow of configuration data from configuration device 121. More specifically, PLD 103 can halt the provision of clock signals to configuration device 121 and, hence, prevent configuration device 121 from further providing configuration data to PLD 103.

Typical conventional active-mode arrangements use this technique to avoid stalling the configuration process. Doing so, however, tends to slow down and, therefore, make less efficient, the configuration process. As described below in detail, the inventive concepts allow uninterrupted configuration of PLD 103 in the active-mode configuration arrangement.

As noted above, PLDs according to the invention include decompression circuitry that processes configuration data. Including decompression capability within PLD 103 allows the use of less costly and less complex configuration devices 121. More specifically, in such an arrangement, configuration device 121 does not include decompression capability, and therefore includes less hardware, costs less, and is more readily available (e.g., one may use off-the-shelf or generic, rather than custom, configuration devices).

Figure 5:
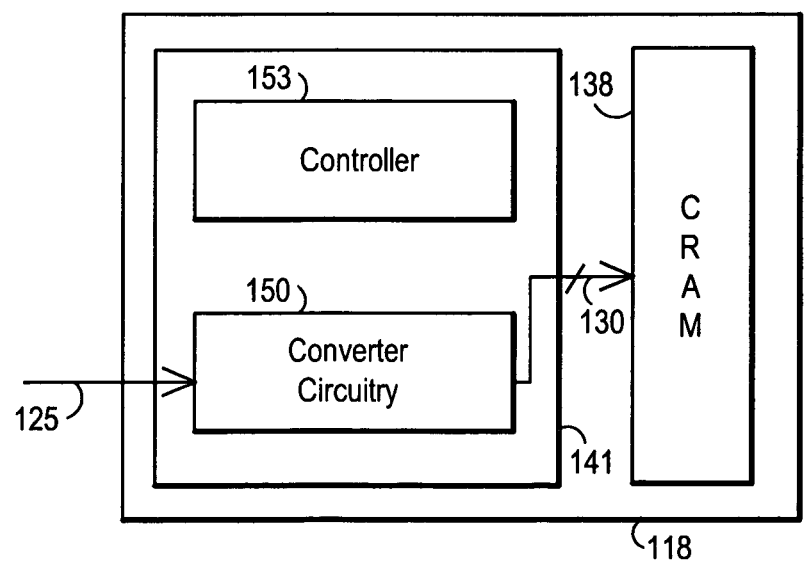
FIG. 5 illustrates a block diagram of a configuration circuitry for use in illustrative embodiments of the invention.

FIG. 5 illustrates a block diagram of configuration circuitry 118 according to an illustrative embodiment of the invention. Configuration circuitry 118 includes controller 153 and converter circuitry 150.

Configuration circuitry 118 receives configuration data via signal link 125, as described above. The configuration data has a serial format. In other words, configuration circuitry 118 may receive the configuration data over one signal link or conductor. The serial data format helps to avoid stalling of the configuration process. As described below in detail, the configuration techniques according to the invention convert the serial configuration data into parallel format for programming PLD 103.

The configuration data further has a compressed or coded format, which provides several advantages over conventional techniques. The compression allows storing larger amounts of configuration data in a configuration device of a given capacity than would an uncompressed (raw data) format. The compression (together with the corresponding decompression in PLD 103, as described below) allows receiving the configuration data and configuring or programming PLD 103 simultaneously. As a result, it avoids slowing the configuration process. Using compression data also avoids stalling the configuration process, and further avoids using a buffer, as noted above.

One may use a variety of compression techniques to compress the data, as persons of ordinary skill in the art who have the benefit of the description of the invention understand. As one example, one may use a compression algorithm or technique that takes advantage of a property present in typical configuration data. More specifically, typical configuration data includes more binary zeros than binary ones.

One may compress the data by taking advantage of that property. Thus, one may compress the configuration data (as described below) and store the compressed data in configuration device 121.

Figures 6, 7:
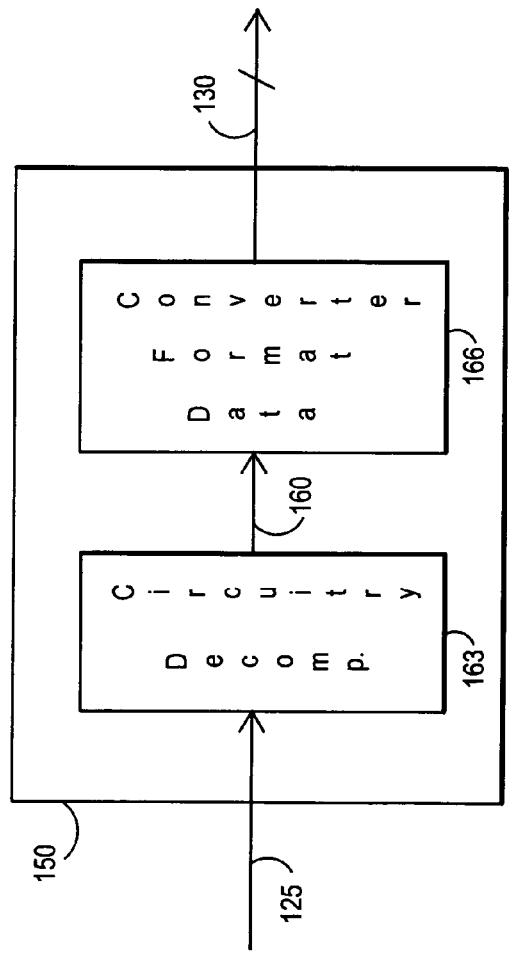
FIG. 6 depicts examples of compression of configuration data for use in an illustrative embodiment according to the invention, using a exemplary technique for compression of the configuration data.
FIG. 7 shows a block diagram of a data converter circuitry according to an exemplary embodiment of the invention.

FIG. 6 shows examples of the compression of configuration data for use in an illustrative embodiment according to the invention. The examples in FIG. 6 show 16-bit configuration data words. As persons of ordinary skill in the art who have the benefit of the description of the invention understand, however, one may use other data widths (e.g., 32 bits), as desired. The choice of data arrangement depends on a variety of factors, such as design and performance specifications for a given implementation, and falls within the knowledge of persons skilled in the art with the benefit of the description of the invention.

Referring to FIG. 6, the compression technique divides each data word into four nibbles, or four 4-bit parts. Each data nibble receives an associated header bit. Thus, a 16-bit data word has four header bits. The header bits combine to form a control nibble. The binary values of the header bits in the control bits depend on the binary values of the bits in the corresponding data nibble.

More specifically, if all bits of a data nibble have a binary zero value, then the header bits in the control nibble that corresponds to that data bit receive binary zero values. Thus, a data nibble with a value 0000 will result in a control nibble with a binary value of 0000. Because a control nibble with binary value 0000 indicates a data word with all zeros and no binary ones, one may discard the data word and use the control nibble as the compressed representation of that data word.

On the other hand, if any of the bits of a data nibble has a binary one value, then the corresponding header bit in the control nibble for that data nibble receives a binary one value. For a binary one value in the control nibble, one uses the control nibble together with the data nibble corresponding to the binary one value in the control nibble. In such a case, one uses the control nibble together with the data nibble(s) (that correspond(s) to the binary one value(s) in the control nibble) as the compressed representation of the data word.

For example, as FIG. 6 illustrates, suppose the data word has a binary value 0100000100000000. One divides the data word into four nibbles, or 0100 0000 1000 0000. The first nibble has a binary one (the second digit from the left), so the corresponding header bit receives a binary one value. The second nibble has all zeros, so the corresponding header bit has a binary zero value. The third nibble has a binary one digit, so the third header bit receives a binary one value. Finally, the fourth nibble has all zeros, resulting in the fourth header bit having a binary zero value.

Assembling the header bits results in a control nibble having a binary value of 1010. The control nibble 1010, together with the data nibbles that have binary one digits, i.e., 0100 and 1000, form the compressed representation of the original data word.

As another example, as FIG. 6 further illustrates, a data word having the binary value 0000000000000001 results in four data nibbles 0000 0000 0000 0001, header bits 0, 0, 0, and 1, and control nibble 0001. Control nibble 0001, together with the data nibble that has a binary one digit (the last data nibble), forms 0001 0001, the compressed representation of the original data word.

The third data word in FIG. 6 includes 16 binary zeros. As described above, the header bits all have binary zero values. Thus, the control nibble, with a binary value 0000, forms the compressed representation of the data word.

The last data word in FIG. 6 has a binary value 0001100001011010, which results indatanibbles 0001 10000101 1010, header bits 1, 1, 1, and 1, and control nibble 1111. Control nibble 1111 and the original data bits form the representation of the data word. Note that in this situation, where each data nibble includes a binary one digit, the representation of the data word does not result in any compression.

Referring back to FIG. 5, converter circuitry 150 processes the configuration data that PLD 103 receives. More specifically, converter circuitry 150 decompresses the configuration data. The decompression operation converts the compressed configuration data from configuration device 121 into decompressed configuration data. Configuration circuitry 118 uses the decompressed configuration data to program PLD 103.

The decompression operation constitutes a counterpart of the compression operation described above. In other words, the particular decompression operation depends on the choice of compression operation. Like the compression operation, the choice of a particular decompression operation depends on various factors, such as design and performance specifications, as persons skilled in the art with the benefit of the description of the invention understand.

Converter circuitry 150 also converts the configuration data from a serial format to a parallel format. In other words, in addition to decompressing the configuration data, converter circuitry 150 changes the format of the configuration data from serial to parallel. Converter circuitry 150 provides the decompressed, parallel-format configuration data to CRAM 138 via signal link 130.

FIG. 7 shows a block diagram of a converter circuitry 150 according to an exemplary embodiment of the invention. Converter circuitry 150 includes decompression circuitry 163 and data format converter 166. Decompression circuitry 163 performs the decompression function described above.

More specifically, decompression circuitry 163 receives compressed configuration data via signal link 125, decompresses the data, and provides the decompressed data to data format converter 166 via signal link 160. Signal link 160 may include a number of signal lines, such as data lines, control line(s), and status line(s), as desired. Data format converter 166 performs the serial-to-parallel data conversion operation described above.

Referring to FIG. 5, controller 153 supervises or controls the operations of configuration circuitry 118. For example, controller 153 controls the decompression operation, the serial-to-parallel conversion operation, or both, either directly or indirectly, as desired. Controller 153 may also control the reception of configuration data via signal link 125, the provision of processed configuration data to CRAM 138 via signal link 130, or both, either directly or indirectly, as desired.

Note that controller 153 may at least in part reside in other parts or areas of PLD 103. Moreover, controller 153 may not constitute a separately identifiable block or circuit, as persons of ordinary skill in the art who have the benefit of the description of the invention understand.

Furthermore, note that one may use uncompressed configuration data in exemplary embodiments according to the invention, as desired. In other words, configuration device 121 may provide uncompressed configuration data to PLD 103 in a serial data format. In those embodiments, one may omit some of the functionality, circuitry, or both, in configuration circuitry 118, as persons of ordinary skill in the art who have the benefit of the description of the invention understand.

Figure 8:
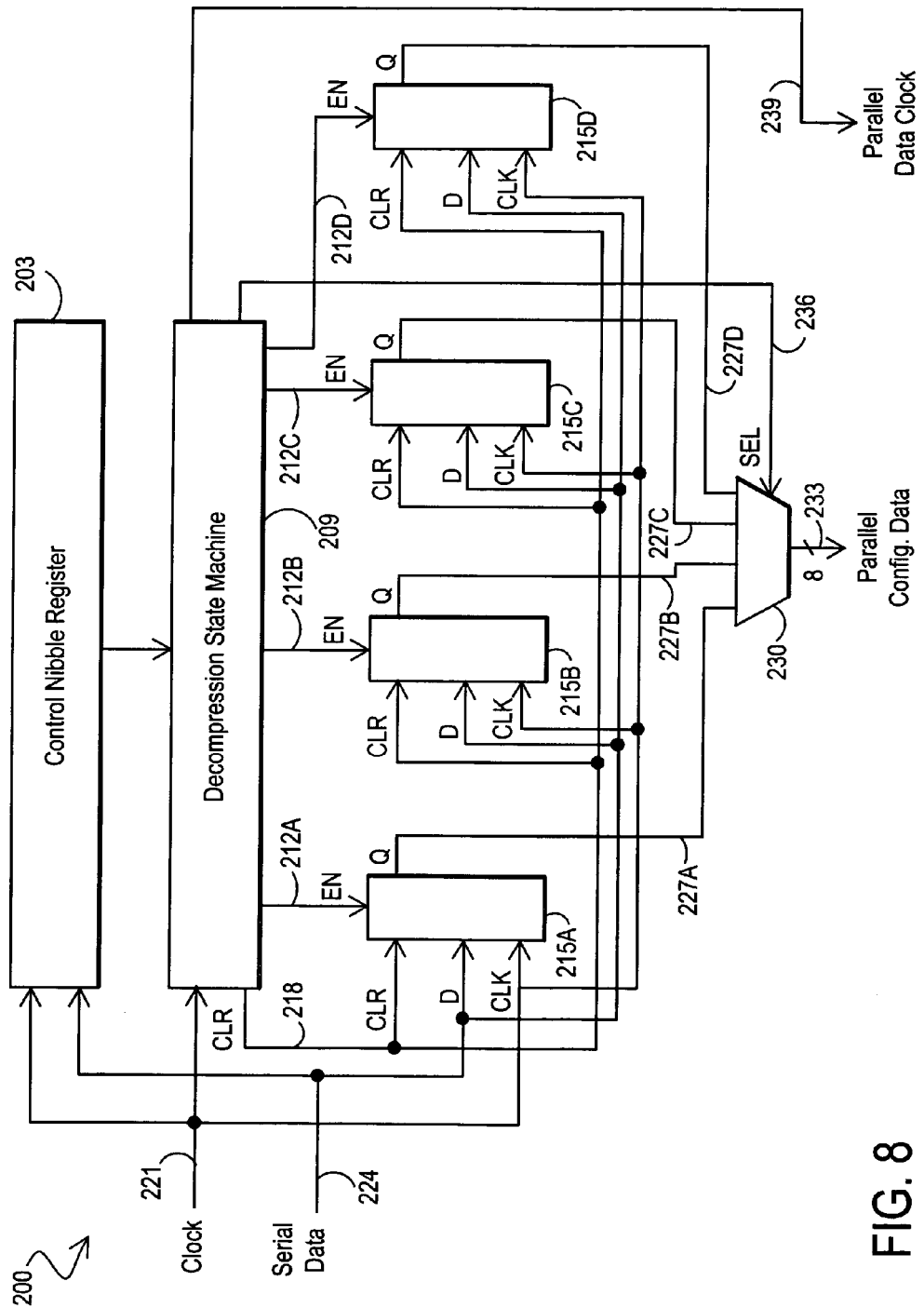
FIG. 8 depicts an illustrative embodiment of a data converter according to the invention.

FIG. 8 shows an illustrative embodiment 200 of a data converter according to the invention. Embodiment 200 includes control nibble register 203, decompression state machine209, data registers 215A-215D, and multiplexer (MUX) 230.

As persons skilled in the art with the benefit of the description of the invention understand, the various blocks and circuitry in embodiment 200 denote an exemplary implementation. Thus, one may use other blocks or circuitry to implement similar embodiments that fall within the scope of the inventive concepts.

As an example, rather than using a state machine, one may use various circuitry to implement the control and supervisory functions that decompression state machine 209 provides. Hence, one may use general controller circuitry, standard cells, or a processor to provide those functions. The choice of implementation for the various blocks and circuitry in embodiment 200 depend on a number of factors that fall within the knowledge of persons skilled in the art with the benefit of the description of the invention. Those factors include, for example, design and performance specifications and implementation choices based on available or desired technology.

The data converter in embodiment 200 receives serial data signal 224 from a configuration device (not shown explicitly). As its name suggests, serial data signal 224 has a serial format. Furthermore, serial data signal 224 may have a compressed format or an uncompressed format, as desired. As noted above, one may use a variety of compression techniques and algorithms to produce compressed data, as persons of ordinary skill in the art who have the benefit of the description of the invention understand.

The data converter also receives clock signal 221. Clock signal 221 facilitates the operation of various parts or blocks of the data converter. More particularly, clock signal 221 feeds clock inputs of control nibble register 203, decompression state machine 209, and data registers 215A-215D. The data converter may receive clock signal 221 from another circuit within PLD 103, such as controller 153 in FIG. 5.

Decompression state machine 209 uses enable (EN) signals 212A-212D to enable and control the loading of data into data registers 215A-215D, respectively. More specifically, each of data registers 215A-215D receives serial data signal 224. Decompression state machine 209 uses enable signals 212A-212D to control which of data registers 215A-215D loads serial data 224 on the next occurrence of clock signal 221.

Each of data registers 215A-215D provides its output data (4 bits each) to MUX 230. Under the supervision and control of decompression state machine 209, MUX 230 provides parallel configuration data 233 for use in programming the PLD within which embodiment 200 resides.

Note that embodiment 200 provides 8-bit parallel output data (configuration data 233). As persons of ordinary skill in the art with the benefit of the description of the invention understand, however, one may modify the circuitry shown in embodiment 200 to accommodate other data formats, widths, configurations, and the like, as desired.

Decompression state machine 209 provides parallel data clock 239. Parallel data clock 239 allows clocking and loading of parallel configuration data 233 into other parts of the PLD within which embodiment 200 resides.

The data converter operates as follows when serial data 224 has a compressed format. The following description of the data converter assumes that one has compressed serial data 224 using the compression technique described above in connection with FIG. 6. As noted above, however, one may use other compression and corresponding decompression techniques and apparatus by making modifications to the embodiments shown. Those modifications fall within the knowledge of persons of ordinary skill in the art who have the benefit of the description of the invention.

In response to clock signal 221, control nibble register 203 loads with control nibbles present in serial data 224. Also at this time, decompression state machine 209 clears data registers 215A-215D. More specifically, decompression state machine 209 applies clear (CLR) signal 218 to the respective synchronous clear inputs of data registers 215A-215D. Consequently, the Q outputs 227A-227D, respectively, of data registers 215A-215D clear.

Decompression state machine 209 uses the control nibble present in serial data 224 to determine how to route the data that follow the control nibble. If the control nibble has a non-zero value, then decompression state machine 209 routes the data that follow the control nibble to data registers 215A-215D. Decompression state machine 209 uses the binary values of the bits in the control nibble to determine which of data registers 215A-215D to load and which of data registers 215A-215D to clear.

As the next control nibble loads, decompression state machine 209 provides the decompressed parallel data in two bytes via MUX 230. More specifically, in response to select (SEL) signal 236, MUX 230 provides two bytes of data as parallel configuration data 233. Other parts of PLD 103 may subsequently use the parallel configuration data to program various blocks and circuitry within PLD 103, as described above.

If the control nibble has a binary zero value (i.e., each bit has a binary zero value), data registers 215A-215D already have the correct values (i.e., binary zero) at their respective Q outputs 227A-227D. Thus, decompression state machine 209 and MUX 233 provide parallel configuration data 233 to other parts of PLD 103 for subsequent configuration.

Note that it takes four clock cycles for four control nibbles to load. Note further that, on the third clock cycle, decompression state machine 209 clears data registers 215A-215D. Because of this sequence of events, decompression state machine 209 has enough time to provide two bytes of data as parallel configuration data 233 before the next four control nibbles load. In this manner, embodiment 200 avoids stalling the configuration device or slowing down the configuration process without using a buffer.

If serial data 224 has an uncompressed format, the data converter operates as follows. The data converter receives serial data 224 in response to clock signal 221. Decompression state machine 209 causes data registers 215A-215D to load four nibbles (i.e., 16 bits) of data extracted from the serial data.

Decompression state machine 209 also causes data registers 215A-215D and MUX 230 to provide two bytes of configuration data as parallel configuration data 233. Other parts of PLD 103 may subsequently use the parallel configuration data to program various blocks and circuitry within PLD 103, as described above. Note that, in this mode of operation, other circuitry and signals in the data converter operate as described above.

As an example of how embodiment 200 processes compressed configuration data, assume that it receives binary value 1010 as a control nibble. The control nibble indicates how many bits follow it. Based on the control nibble, the circuitry receives and processes any additional bits of data that constitute part of the configuration data. The value of the control nibble indicates whether additional bits (in multiples of four bits) follow or no additional bits follow.

More specifically, the number of binary 1 bits in the control nibble corresponds to the number of additional nibbles of configuration data. In this example, the control nibble (i.e., 1010) has two binary 1 bits. Thus, the data converter receives and processes two additional nibbles of data.

The control nibble loads in control nibble register 203. Decompression state machine 209 keeps track of the number of nibbles that load in control nibble register 203. While the control nibble loads, decompression state machine synchronously clears data registers 215A-215D, as described above.

Once the control nibble has loaded, decompression state machine directs which of the data registers load with the incoming serial data. The position of the binary 1 digits in the control nibble indicates those of data registers 215A-215D that load with serial data. In this example, the value of the control nibble, 1010, indicates that data register 215A and data register 215C load with data.

Decompression state machine 209 uses enable signal 212A to enable the loading of the following four bits of incoming data into data register 215A. Once the loading of the data completes, decompression state machine 209 de-asserts enable signal 212A.

Next, decompression state machine 209 uses enable signal 212C to enable the loading of an additional four bits of incoming data into data register 215C. After the data load, decompression state machine 209 de-asserts enable signal 212C. Note that data register 215B and data register 215D remain in their cleared states during the above operations.

Once it has de-asserted enable signal 212C, decompression state machine 209 allows control nibble register 203 to receive the control nibble for an additional packet of compressed incoming data. While receiving the new control nibble, decompression state machine causes the data assembled in data registers 215A-215D to output as two bytes of parallel configuration data 233. Decompression state machine 209 uses MUX 233 and select signal 236 to accomplish this operation, as described above.

Figure 9:
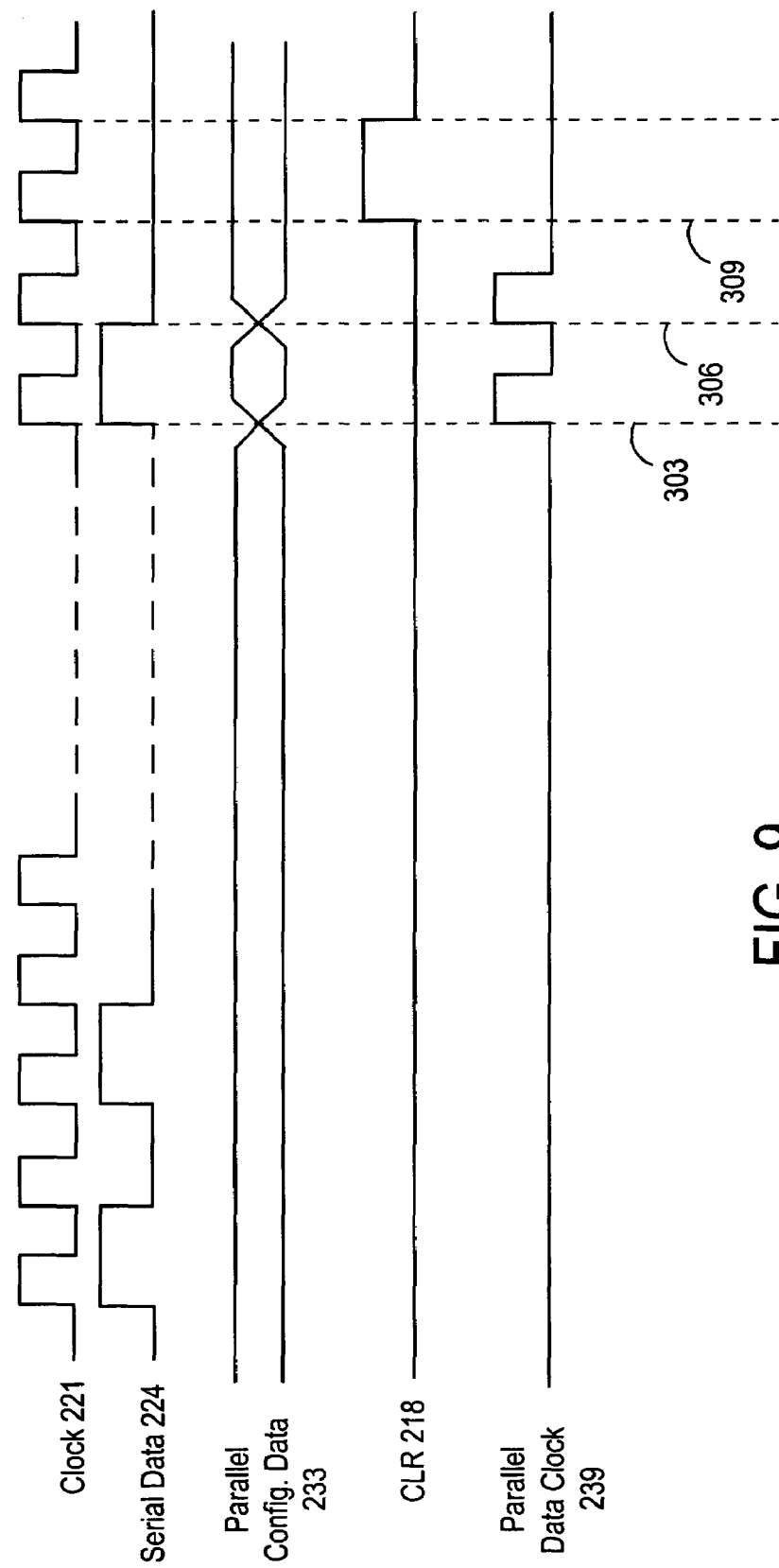
FIG. 9 illustrates a timing diagram for various signals and events in an exemplary embodiment of a data converter according to the invention.

FIG. 9 depicts a timing diagram for various signals and events in an exemplary embodiment according to the invention. More specifically, the timing diagram corresponds to embodiment 200 in FIG. 8.

The timing diagram in FIG. 9 shows waveforms for clock signal 221, serial data signal 224, parallel configuration data 233, clear signal 218, and parallel data clock signal 239. Note that the timing diagram does not show or depict the complete operation of the inventive concepts. Rather, it illustrates an exemplary set of waveforms in one embodiment of the invention. Furthermore, the sequence of events described below assumes that the data converter circuitry (see FIG. 8) has been in operation for a period of time and has been receiving and processing serial configuration information.

Referring to FIG. 9, serial data signal 224 changes value synchronously with clock signal 221. Time 303 denotes the beginning of loading a control nibble for two subsequent bytes of serial data. Time 303 also denotes the provision of a first byte of two assembled bytes of parallel configuration data. The waveform for parallel configuration data corresponds to the periods where the parallel data are available and valid.

Time 306 denotes the provision of the second byte of the two assembled bytes of parallel configuration data. Time 309 corresponds to the assertion of the clear signal 218, which clears all of the data registers (see FIG. 8 and the corresponding description above). The entire cycle may then repeat to receive serial configuration data and to provide parallel configuration data for programming the PLD.

Note that one may apply the inventive concepts effectively to programmable circuitry or ICs known by other names in the art, as desired, and as persons skilled in the art with the benefit of the description of the invention understand. Such circuitry include devices known as complex programmable logic device (CPLD), programmable gate array (PGA), and field programmable gate array (FPGA).

Referring to the figures, persons of ordinary skill in the art will note that the various blocks shown may depict mainly the conceptual functions and signal flow. The actual circuit implementation may or may not contain separately identifiable hardware for the various functional blocks.

For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. A programmable logic device (PLD), the programmable logic device (PLD) comprising configuration circuitry, the configuration circuitry adapted to receive serial configuration data, wherein the configuration circuitry is configured to program a function of the programmable logic device (PLD) without using an input buffer to store the configuration data before processing of the configuration data by the configuration circuitry.

2. The programmable logic device (PLD) according to claim 1, wherein the configuration circuitry receives the serial configuration data from a configuration device external to the programmable logic device (PLD).

3. The programmable logic device (PLD) according to claim 2, wherein the function of the programmable logic device (PLD) is programmed without stalling the configuration device.

4. The programmable logic device (PLD) according to claim 1, wherein the function of the programmable logic device (PLD) is programmed in an active configuration mode.

5. The programmable logic device (PLD) according to claim 1, wherein the function of the programmable logic device (PLD) is programmed in a passive configuration mode.

6. The programmable logic device (PLD) according to claim 5, wherein the configuration circuitry is further adapted to receive compressed serial configuration data.

7. The programmable logic device (PLD) according to claim 6, wherein the configuration circuitry comprises a decompression circuitry, the decompression circuitry adapted to decompress the compressed serial configuration data into decompressed configuration data.

8. The programmable logic device (PLD) according to claim 7, wherein the configuration circuitry further comprises a data format converter circuit, the data format converter circuit adapted to convert the decompressed configuration data into parallel configuration data.

9. A data-processing system, comprising:
a configuration device, the configuration device adapted to provide serial configuration data; and
a programmable logic device (PLD), comprising:
a data converter circuit, the data convener circuit adapted to convert the serial configuration data into parallel configuration data to program a function of the programmable logic device (PLD),
wherein the function of the programmable logic device (PLD) is programmed without stalling the configuration device.

10. The data-processing system according to claim 9, wherein the serial configuration data comprises serial compressed data.

11. The data-processing system according to claim 10, wherein the data converter circuit comprises a decompression circuit, the decompression circuit adapted to decompress the serial compressed data to provide decompressed data.

12. The data-processing system according to claim 11, wherein the data converter further comprises a data format converter circuit, the data format converter circuit adapted to transform the decompressed data into parallel data.

13. The data-processing system according to claim 12, wherein the parallel data is used to program the function of the programmable logic device (PLD).

14. The data-processing system according to claim 13, wherein the decompression circuitry comprises a decompression state machine.

15. The data-processing system according to claim 14, wherein the data converter further comprises a first register, the register adapted to receive the serial compressed data in response to a clock signal.

16. The data-processing system according to claim 15, wherein the data converter further comprises a plurality of registers, each of the plurality of registers adapted to receive the serial compressed data in response to a respective control signal provided by the decompression state machine.

17. The data-processing system according to claim 16, wherein the data format converter circuit comprises a multiplexer, the multiplexer coupled to the plurality of registers and to the decompression state machine.

18. The data-processing system according to claim 10, wherein the configuration device comprises a FLASH memory.

19. The data-processing system according to claim 10, wherein the function of the programmable logic device (PLD) is programmed in a passive configuration mode.

20. The data-processing system according to claim 19, wherein the configuration device provides a control signal to the programmable logic device (PLD).

21. A data-processing system, comprising:
a configuration device, the configuration device adapted to provide serial configuration data; and a programmable logic device (PLD), comprising:
a data converter circuit, the data converter circuit adapted to convert the serial configuration data into parallel configuration data to program a function of the programmable logic device (PLD),
wherein the programmable logic device (PLD) is configured to be programmed without using a buffer to store the serial configuration data before processing of the configuration data by the data converter circuit.

22. The data-processing system according to claim 21, wherein the serial configuration data comprises serial compressed data.

23. The data-processing system according to claim 22, wherein the data converter circuit comprises a decompression circuit, the decompression circuit adapted to decompress the serial compressed data to provide decompressed data.

24. The data-processing system according to claim 23, wherein the data converter further comprises a data format converter circuit, the data format converter circuit adapted to transform the decompressed data into parallel data.

25. The data-processing system according to claim 24, wherein the parallel data is used to program the function of the programmable logic device (PLD).

26. The data-processing system according to claim 25, wherein the decompression circuitry comprises a decompression state machine.

27. The data-processing system according to claim 26, wherein the data converter further comprises a first register, the register adapted to receive the serial compressed data in response to a clock signal.

28. The data-processing system according to claim 27, wherein the data converter further comprises a plurality of registers, each of the plurality of registers adapted to receive the serial compressed data in response to a respective control signal provided by the decompression state machine.

29. The data-processing system according to claim 28, wherein the data format converter circuit comprises a multiplexer, the multiplexer coupled to the plurality of registers and to the decompression state machine.

30. The data-processing system according to claim 22, wherein the configuration device comprises a FLASH memory.

31. The data-processing system according to claim 22, wherein the function of the programmable logic device (PLD) is programmed in an active configuration mode.

32. The data-processing system according to claim 22, wherein the function of the programmable logic device (PLD) is programmed in a passive configuration mode.

33. A programmable logic device (PLD), comprising:
means for receiving serial, compressed configuration data from a configuration device without stalling the configuration device;
means for decompressing the serial, compressed configuration data to provide decompressed data; and
means for converting the decompressed data into parallel configuration data.

34. The programmable logic device (PLD) according to claim 33, further comprising means for programming a function of the programmable logic device (PLD) by using the parallel configuration data.

35. The programmable logic device (PLD) according to claim 34, wherein programming the function of the programmable logic device (PLD) comprises programming a programmable logic circuit.

36. The programmable logic device (PLD) according to claim 34, wherein programming the function of the programmable logic device (PLD) comprises programming a programmable interconnect.

37. The programmable logic device (PLD) according to claim 35, wherein the function of the programmable logic device (PLD) is programmed in an active configuration mode.

38. The programmable logic device (PLD) according to claim 35, wherein the function of the programmable logic device (PLD) is programmed in a passive configuration mode.

39. The programmable logic device (PLD) according to claim 36, wherein the function of the programmable logic device (PLD) is programmed in a passive configuration mode.

40. The programmable logic device (PLD) according to claim 36, wherein the function of the programmable logic device (PLD) is programmed in a active configuration mode.

41. A method of configuring a programmable logic device (PLD), the method comprising:
receiving serial configuration data by using a configuration circuit that is configured to program a function of the programmable logic device (PLD) without using an input buffer to store the configuration data before processing by the configuration circuit, wherein the serial configuration data is adapted to configure a function of the programmable logic device (PLD); and
configuring the function of the programmable logic device (PLD) by using the serial configuration data.

42. The method according to claim 41, wherein receiving serial configuration data further comprises receiving serial configuration data from a configuration device external to the programmable logic device (PLD).

43. The method according to claim 42, wherein configuring the function of the programmable logic device (PLD) further comprises configuring the function of the programmable logic device (PLD) without stalling the configuration device.

44. The method according to claim 41, wherein configuring the function of the programmable logic device (PLD) further comprises performing the configuration in an active mode.

45. The method according to claim 41, wherein configuring the function of the programmable logic device (PLD) further comprises performing the configuration in a passive mode.

46. The method according to claim 45, wherein receiving serial configuration data further comprises receiving compressed serial configuration data.

47. The method according to claim 46, wherein configuring the function of the programmable logic device (PLD) further comprises decompressing the compressed serial configuration data to provide decompressed configuration data.

48. The method according to claim 47, wherein configuring the function of the programmable logic device (PLD) further comprises converting the decompressed configuration data into parallel configuration data.

49. The method according to claim 48, wherein configuring the function of the programmable logic device (PLD) further comprises using the parallel configuration data to configure programmable logic.

50. The method according to claim 48, wherein configuring the function of the programmable logic device (PLD) further comprises using the parallel configuration data to configure programmable interconnect.

* * * * *